(12) United States Patent
Huang et al.

(10) Patent No.: US 10,553,489 B2
(45) Date of Patent: Feb. 4, 2020

(54) PARTITIONED WAFER AND SEMICONDUCTOR DIE

(71) Applicant: TAIWAN SEMICONDUCTOR MANUFACTURING COMPANY, LTD., Hsinchu (TW)

(72) Inventors: Wei-Hsiang Huang, Hsinchu (TW); Chung-Chuan Tseng, Hsinchu (TW); Chia-Wei Liu, Zhubei (TW); Li Hsin Chu, New Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 15/890,041

(22) Filed: Feb. 6, 2018

(65) Prior Publication Data

US 2018/0158735 A1 Jun. 7, 2018

Related U.S. Application Data

(62) Division of application No. 15/195,027, filed on Jun. 28, 2016, now Pat. No. 9,905,466.

(51) Int. Cl.
*H01L 21/78* (2006.01)
*H01L 21/308* (2006.01)
*H01L 21/68* (2006.01)
*H01L 23/544* (2006.01)
*H01L 21/683* (2006.01)

(52) U.S. Cl.
CPC ............ *H01L 21/78* (2013.01); *H01L 21/308* (2013.01); *H01L 21/6836* (2013.01); *H01L 23/544* (2013.01)

(58) Field of Classification Search
CPC ......... H01L 21/78; H01L 21/30; H01L 21/68; H01L 23/54
USPC ......... 438/462, 283, 14, 125, 113, 114, 460, 438/127; 257/620, 491, 737, 659, 257/E21.599, E21.214, E21.09, E21.577
See application file for complete search history.

(56) References Cited

U.S. PATENT DOCUMENTS

| | | | |
|---|---|---|---|
| 6,436,793 B1 * | 8/2002 | Kneezel | B41J 2/1601 257/E21.599 |
| 6,972,444 B1 * | 12/2005 | Iacob | H01L 22/324 257/202 |
| 8,883,615 B1 | 11/2014 | Holden et al. | |
| 9,496,165 B1 * | 11/2016 | Bedell | H01L 21/6835 |
| 2004/0113283 A1 * | 6/2004 | Farnworth | H01L 21/3043 257/782 |
| 2007/0262420 A1 * | 11/2007 | Arita | H01J 37/32082 257/620 |
| 2008/0102598 A1 * | 5/2008 | Herman | H01L 21/02381 438/424 |
| 2008/0265265 A1 * | 10/2008 | Xiong | H01L 33/641 257/97 |

(Continued)

*Primary Examiner* — Sheikh Maruf
(74) *Attorney, Agent, or Firm* — Hauptman Ham, LLP (57) ABSTRACT

A wafer includes a first set of dies and a second set of dies. The wafer further includes a scribe line separating the first set of dies from the second set of dies, wherein the scribe line has a first width. The wafer further includes a plurality of trenches between adjacent dies of the first set of dies and connected to the scribe line, wherein the plurality of trenches has a second width less than the first width, and a depth of each trench of the plurality of trenches is less than a thickness of the wafer.

20 Claims, 7 Drawing Sheets

(56) References Cited

U.S. PATENT DOCUMENTS

| | | | | |
|---|---|---|---|---|
| 2008/0286938 A1* | 11/2008 | Pu | H01L 21/78 | 438/458 |
| 2009/0102042 A1* | 4/2009 | Uoya | H01L 21/6835 | 257/690 |
| 2009/0181520 A1* | 7/2009 | Li | H01L 21/78 | 438/462 |
| 2009/0218669 A1* | 9/2009 | Wang | H01L 21/6835 | 257/686 |
| 2009/0267083 A1* | 10/2009 | Cui | C30B 25/18 | 257/79 |
| 2010/0059772 A1* | 3/2010 | Yamanaka | H01L 33/20 | 257/98 |
| 2010/0081256 A1* | 4/2010 | Uemura | H01L 33/0079 | 438/462 |
| 2010/0120227 A1* | 5/2010 | Grivna | H01L 21/78 | 438/462 |
| 2010/0301459 A1* | 12/2010 | Akiba | H01L 24/03 | 257/620 |
| 2011/0042797 A1* | 2/2011 | Park | H01L 21/563 | 257/690 |
| 2011/0127646 A1* | 6/2011 | Kang | H01L 21/6835 | 257/620 |
| 2011/0244657 A1* | 10/2011 | Grivna | H01L 21/78 | 438/462 |
| 2012/0080673 A1* | 4/2012 | Winter | H01L 23/544 | 257/48 |
| 2012/0156823 A1* | 6/2012 | Myung | H01L 21/78 | 438/65 |
| 2013/0049195 A1* | 2/2013 | Wu | H01L 24/97 | 257/738 |
| 2013/0183827 A1* | 7/2013 | Millward | H01L 21/0273 | 438/694 |
| 2013/0187178 A1* | 7/2013 | Tischler | H01L 33/50 | 257/88 |
| 2013/0248860 A1* | 9/2013 | Rong | H01L 23/5381 | 257/48 |
| 2013/0337633 A1 | 12/2013 | Seddon | | |
| 2014/0017878 A1 | 1/2014 | Monadgemi | | |
| 2014/0069325 A1* | 3/2014 | Kawanishi | C30B 19/00 | 117/54 |
| 2014/0141597 A1 | 5/2014 | Mohammed | | |
| 2014/0203416 A1 | 7/2014 | Huang et al. | | |
| 2014/0252375 A1 | 9/2014 | Briere | | |
| 2014/0264268 A1* | 9/2014 | Tseng | H01L 33/505 | 257/13 |
| 2014/0264859 A1* | 9/2014 | Chen | H01L 21/78 | 257/738 |
| 2014/0273402 A1* | 9/2014 | Tsai | H01L 21/78 | 438/463 |
| 2015/0011074 A1 | 1/2015 | Han et al. | | |
| 2015/0021733 A1 | 1/2015 | Nakamura et al. | | |
| 2015/0024575 A1* | 1/2015 | Hu | H01L 23/544 | 438/462 |
| 2015/0044810 A1* | 2/2015 | Cheng | H01L 27/14 | 438/68 |
| 2015/0214109 A1* | 7/2015 | Lei | H01L 21/78 | 438/462 |
| 2015/0221554 A1* | 8/2015 | Kosaka | H01L 21/78 | 438/462 |
| 2015/0279739 A1* | 10/2015 | Lei | H01L 21/78 | 438/462 |
| 2015/0332911 A1* | 11/2015 | Priewasser | H01L 21/6835 | 156/154 |
| 2016/0027697 A1* | 1/2016 | Lei | H01L 21/0337 | 438/463 |
| 2016/0042997 A1* | 2/2016 | Takahashi | H01L 21/6836 | 438/464 |
| 2016/0071819 A1* | 3/2016 | Fuergut | H01L 21/30604 | 257/774 |
| 2016/0104626 A1* | 4/2016 | Nelson | H01L 23/3114 | 438/114 |
| 2016/0163579 A1* | 6/2016 | Nakamura | H01L 21/6835 | 428/64.1 |
| 2016/0172203 A1* | 6/2016 | Ono | H01L 21/6836 | 438/462 |
| 2016/0204071 A1* | 7/2016 | Liu | H01L 21/78 | 257/620 |
| 2016/0336211 A1* | 11/2016 | Chen | H01L 21/6835 | |
| 2017/0076969 A1* | 3/2017 | Shirono | H01L 21/6835 | |
| 2017/0084544 A1* | 3/2017 | Chen | H01L 23/544 | |
| 2017/0345716 A1* | 11/2017 | Brunnbauer | H01L 21/3083 | |

* cited by examiner

PARTITIONED WAFER AND SEMICONDUCTOR DIE

PRIORITY CLAIM

The present application is a divisional of U.S. application Ser. No. 15/195,027, filed Jun. 28, 2016, which is incorporated herein by reference in its entirety.

BACKGROUND

Semiconductor manufacturing includes forming many integrated circuits on a single semiconductor wafer using variable manufacturing processes, such as photolithography, deposition, implantation, and etching. Following formation of the integrated circuits, the wafer is diced or sawed in order to separate the individual integrated circuits into chips or dies.

In some approaches, the wafer is diced using a dicing saw to cut through a portion of the wafer between adjacent dies. In some approaches, a wide trench is formed in the wafer to help guide the dicing saw in order to reduce the risk of damage to the adjacent dies. This wide trench is called a scribe line, in some instances. The width of the scribe line is sufficient to permit the dicing saw to traverse the scribe line without contacting the adjacent dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As technology node sizes decrease and integrated circuits become smaller, a reduced amount of a wafer is utilized during a manufacturing process. The reduced utilization of the wafer is due to the increase in the number of scribe lines within the wafer in order to permit dicing of the wafer after formation of the individual dies on the wafer. The scribe lines are used to permit passage of a dicing saw with a reduced risk of damage to adjacent dies on the wafer. Scribe lines also include features such as test pads to test performance of the dies formed during the manufacturing process; alignment marks for assisting with alignment of various masks during the manufacturing process; and/or other identifying information.

By reducing a number of scribe lines, a number of dies formable on a wafer increases. In order to facilitate partitioning of the dies from the wafer while reducing a number of scribe lines, trenches are etched into the wafer between adjacent dies within a set of dies. A scribe line surrounds the set of dies in order to provide a location for test pads, alignment marks and/or other identifying information. Scribe lines are a location on the wafer where a dicing saw is used to cut the wafer to remove dies from the wafer. In some embodiments, the scribe lines do not extend below a bottom-most element of a die on the wafer. In contrast, a trench is narrower than a width of a dicing saw and extends below a bottom-most element of the dies on the wafer. In some embodiments, trenches are free of test pads, alignment marks and/or other identifying information. By using the combination of trenches and scribe lines, manufacturing capacity is increased because a number of dies formed on each wafer is increased; and manufacturing quality is maintained because the scribe lines still provide adequate area for formation of testing pads, alignment marks and/or other identifying information.

Figure 1:
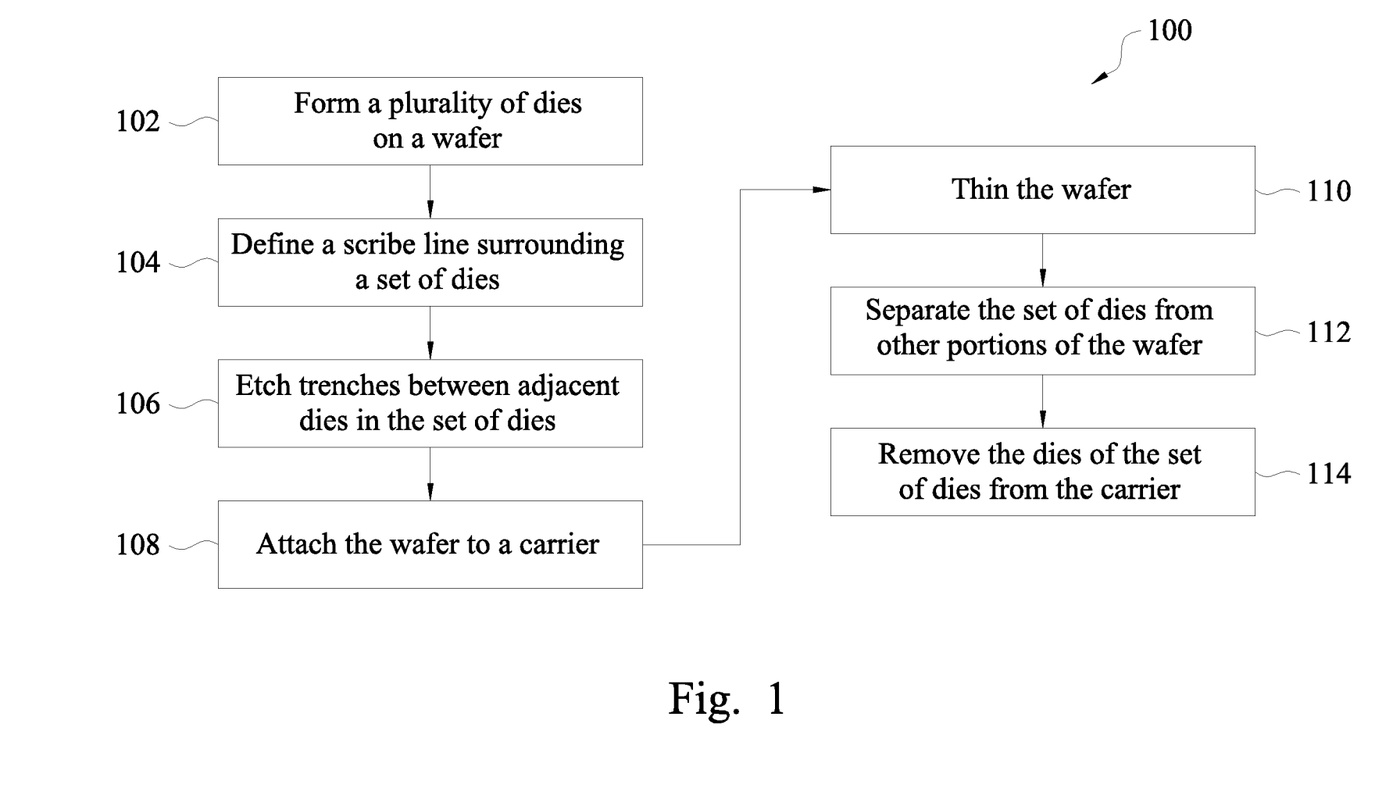
FIG. 1 is a flowchart of a method of partitioning a wafer in accordance with some embodiments.

FIG. 1 is a flowchart of a method 100 of partitioning a wafer in accordance with some embodiments. Method 100 includes an operation 102 in which a plurality of dies is formed on a wafer. The plurality of dies is formed through a combination of manufacturing processes, such as photolithography, deposition, etching, epitaxy, implantation or other suitable processes. In some embodiments, the plurality of dies includes planar devices, such as complementary metal-oxide-semiconductor (CMOS) devices, high electron mobility transistors (HEMTs), bi-polar junction transistors (BJTs) or other suitable planar devices. In some embodiments, the plurality of dies includes fin field effect transistors (FinFETs). In some embodiments, the plurality of dies includes gate-all-around (GAA) transistors or nanowire transistors. In some embodiments, the plurality of dies includes passive components, such as capacitors, resistors, inductors or other suitable passive components. In some embodiments, the plurality of dies includes a combination of passive devices and active devices, such as transistors or other suitable active devices.

The wafer includes a substrate for supporting the plurality of dies. In some embodiments, devices of the plurality of dies extend into the substrate. In some embodiments, the substrate includes an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In some embodiments, the alloy semiconductor substrate has a gradient SiGe feature in which the Si and Ge composition change from one ratio at one location to another ratio at another location of the gradient SiGe feature. In some embodiments, the alloy SiGe is formed over a silicon substrate. In some embodiments, the substrate is a strained SiGe on Si substrate. In some embodiments, the semiconductor substrate has a semiconductor on insulator structure, such as a silicon on insulator (SOI) structure. In some embodiments, the semiconductor substrate includes a doped epi layer or a buried layer. In some embodiments, the compound semiconductor substrate has a multilayer structure, or the substrate includes a multilayer compound semiconductor structure.

In some embodiments, every die of the plurality of dies has a same function. In some embodiments, at least one die of the plurality of dies has a different function from another die of the plurality of dies. In some embodiments, each die of the plurality of dies has a same size. In some embodiments, at least one die of the plurality of dies has a different size from another die of the plurality of dies.

Method 100 continues with operation 104 in which a plurality of scribe lines is defined surrounding a set of dies. The set of dies includes several dies of the plurality of dies. The scribe lines extend around a perimeter of each set of dies. The scribe lines near the edge of the wafer are between the set of dies and the edge of the wafer. The scribe lines spaced from an edge of the wafer are between adjacent sets of dies.

In some embodiments, the scribe lines include a first region having testing structures for testing performance of dies of the set of dies; or dummy structures; and a second region wherein a dicing saw will segment the wafer. In some embodiments, the first region of the scribe line includes electro-static discharge (ESD) structures. In some embodiments, the second region includes alignment marks, monitoring marks such as CD (critical dimension) bars, or other identifying information. In some embodiments, the scribe lines include a third region having testing structures or dummy structures associated with a different set of dies. In some embodiments, the second region is between the first region and the third region.

In some embodiments, the scribe lines are defined by recesses in layers over the substrate. In some embodiments, the scribe lines are defined by recesses in the substrate. In some embodiments, the scribe lines are locations in the wafer where no devices are formed. In some embodiments, a width of the scribe line ranges from about 60 microns (μm) to about 100 μm. A width of the scribe lines is determined by a technology node as well as dimensions of a dicing saw. If the width of the scribe line is too small, dies adjacent to the scribe line are damaged by the dicing saw in some instances. If the width of the scribe line is too large, utilization of the wafer is decreased without a significant increase in functionality in some instances. In some embodiments, a width of at least one scribe line is different from a width of another scribe line. In some embodiments, every scribe line has a same width.

Method 100 continues with operation 106 in which trenches are etched between adjacent dies within the set of dies. The trenches separate individual dies within the set of dies. The trenches connect to the scribe lines at the boundary of the set of dies. The trenches are defined by a photolithography and etching process. The trenches are defined using a reticle pattern. The reticle pattern is transferred to the wafer using a lithographic process. In some embodiments, a ratio between a size of the pattern of the reticle and the size of the pattern on the wafer ranges from about 1:1 to about 4:1. If the ratio is too large, then precise transfer of the pattern is difficult. If the ratio is too small, then creation of the reticle pattern is difficult.

In some embodiments, the trenches are defined by depositing a photomask over the dies; patterning the photomask to form openings in the photomask and etching the wafer through the openings in the photomask. In some embodiments, a width of the trenches ranges from about 0.8 μm to about 1.1 μm. A width of the trench is determined by a technology node and the etching process used to form the trench. If the width of the trench is too small, reliably forming the trench is difficult in some instances, i.e., production efficiency is too low. If the width of the trench is too large, utilization of the wafer is decreased without a significant increase in functionality in some instances. In some embodiments, a width of at least one trench in the set of dies is different from a width of another trench in the set of dies. In some embodiments, every trench in a set of dies has a same width. In some embodiments, a trench in one set of dies has a different width than a trench in a different set of dies. In some embodiments, every trench in the wafer has a same width.

The trench extends into the substrate to a depth greater than a deepest element of any die on the wafer. The depth of trenches is substantially uniform across the entire wafer. Substantially uniform depth of the trenches helps to avoid the risk of etching the trenches resulting in partitioning of the die during the etching process. In some embodiments, the depth of the trenches varies as a result of manufacturing variation across the wafer. In some embodiments, the depth of the trench, measured from a top of the dies to a bottom of the trench, ranges from about 4 μm to about 5.5 μm. In some embodiments, a ratio between the depth of the trench and the overall thickness of the wafer, inclusive of the height of the dies, ranges from about 66% to about 95%. A depth of the trench is determined by a depth of components of the dies and the etching process used to form the trench. If the depth of the trench is too small, components of the die will be damaged during partitioning of the wafer in some instances. If the depth of the trench is too large, reliably forming the trench is difficult due to the high aspect ratio or the dies are completely removed from the wafer by the etching process to form the trench in some instances.

In some embodiments, a dielectric material is deposited into the trenches following formation of the trenches. An etch selectivity between the dies and the dielectric material is sufficiently high that the dielectric material is removable without damaging the dies to an extent that impacts functionality of the dies. In some embodiments, the dielectric material includes silicon oxide, silicon nitride or silicon oxynitride. In some embodiments, a top surface of the dielectric material is substantially planar with a top surface of the dies. In some embodiments, the dielectric material partially fills the trenches. In some embodiments, the dielectric material at least partially fills the scribe lines. In some embodiments, the dielectric material completely fills the trenches and the scribe lines. In some embodiments, the dielectric material is deposited by chemical vapor deposition (CVD), physical vapor deposition (PVD), atomic layer deposition (ALD), or another suitable deposition process.

Method 100 continues with operation 108 in which the wafer is attached to a carrier. The carrier provides mechanical support for the wafer during subsequent processing of the wafer. The carrier is attached to a top of the dies to expose a bottom surface of the wafer. In some embodiments, a diameter of the carrier is greater than a diameter of the wafer.

In some embodiments, the carrier is a blank silicon wafer. In some embodiments, the carrier includes glass, quartz, ceramic, silicon oxide, aluminum oxide, polymer plastic, an acrylic-based material, or another suitable material. In some embodiments, the carrier is reusable. In some embodiments, the carrier is non-reusable.

In some embodiments, the wafer is attached to the carrier using an adhesive. The adhesive is removable by chemical or mechanical processes. In some embodiments, the adhesive is a multi-layered adhesive. In some embodiments, the adhesive extends over edges of the wafer. In some embodiments, the adhesive is applied using a spin-on or lamination process. In some embodiments, the adhesive includes a pressure sensitive adhesive, a radiation curable adhesive, an epoxy, or another suitable adhesive.

Method 100 continues with operation 110 in which the wafer is thinned. The wafer is thinned by removing portions of the substrate starting from the bottom surface of the substrate. The wafer is thinned to expose a bottom of the trenches between dies in the set of dies. In some embodiments which include a dielectric material in the trenches, the wafer is thinned to expose the dielectric material.

In some embodiments, the thinning process includes a grinding process. In some embodiments, the thinning process includes a chemical mechanical planarization (CMP) process. In some embodiments, the CMP includes a high removal rate process in combination with a low removal rate process. In some embodiments, the thinning process includes an etching process. In some embodiments, the thinning process includes a combination of grinding, CMP or etching. For example, in some embodiments, CMP is performed to rapidly remove a portion of the substrate, and then an etching is performed to further reduce the thickness of the substrate and decrease a total thickness variation (TTV) of the wafer.

In some embodiments, the thinning process exposes a dielectric material in the scribe lines. In some embodiments, the thinning process does not expose a bottom surface of the scribe lines.

Method 100 continues with operation 112 in which the set of dies is separated from other portions of the wafer. The set of dies is separated from other portions of the wafer using the dicing saw. The dicing saw cuts along the scribe lines in order to separate the set of dies from other portions of the wafer. In some embodiments which include the dielectric material in the scribe lines, separating the set of dies from other portions of the wafer includes removing the dielectric material, e.g., using etching.

In some embodiments which include a dielectric material in the trenches, the dielectric material is removed prior to operation 112. In some embodiments, the dielectric material is removed after operation 112.

Method 100 continues with operation 114 in which the dies of the set of dies are removed from the carrier. The dies are removed from the carrier using a de-bonding process. In some embodiments, the de-bonding process includes dissolving the adhesive. In some embodiments, the de-bonding process includes radiating the adhesive with electromagnetic radiation.

The dies are able to be incorporated into semiconductor devices. For example, the dies are bonded to other dies to form a three-dimension integrated circuit (3DIC) in some embodiments. In some embodiments, the dies are attached to other elements of a semiconductor device prior to removing the dies from the carrier. In some embodiments, the dies are transferred to a different carrier for incorporation into the semiconductor devices. In some embodiments, the dies are removed from the carrier prior to attaching the die to other elements of the semiconductor device.

In some embodiments, method 100 includes additional operations, such as depositing the dielectric material, removing the dielectric material, packaging of dies, or other suitable processes. In some embodiments, at least one operation of method 100 is omitted. For example, in some embodiments, operation 102 is omitted if a wafer is received already including dies formed thereon. In some embodiments, an order of operations of method 100 is adjusted. For example, in some embodiments, the dies are removed from the carrier prior to separating the set of dies from other portions of the wafer; or the scribe lines are defined after the trenches are etched.

By utilizing method 100 a number of dies formable on a wafer is increased in comparison with other approaches. The increase in the number of dies formable on the wafer is due to the reduction of the number of scribes lines on the wafer. A number of dies formable on a wafer also depends on a technology node of the manufacturing process. For example, in some approaches, a number of dies formable on a 12-inch wafer ranges from about $10^4$-$10^6$ dies; and a number of dies formable on an 8-inch wafer ranges from about $5\times10^3$ to about $5\times10^5$. In contrast, utilizing the trenches in method 100 a number of dies formable on a wafer increases by about two times or more. For example, if $10^6$ dies could be formed on a 12-inch wafer using another approach, method 100 would permit formation of $2\times10^6$ dies on the 12-inch wafer. As technology nodes continue to decrease, a difference between the number of dies formable on a wafer using method 100 and the number of dies formable on the wafer using other approaches will continue to increase. In some embodiments, a number of dies formable on a wafer using method 100 ranges from about $10^4$ to about $5\times10^7$.

Figure 2:
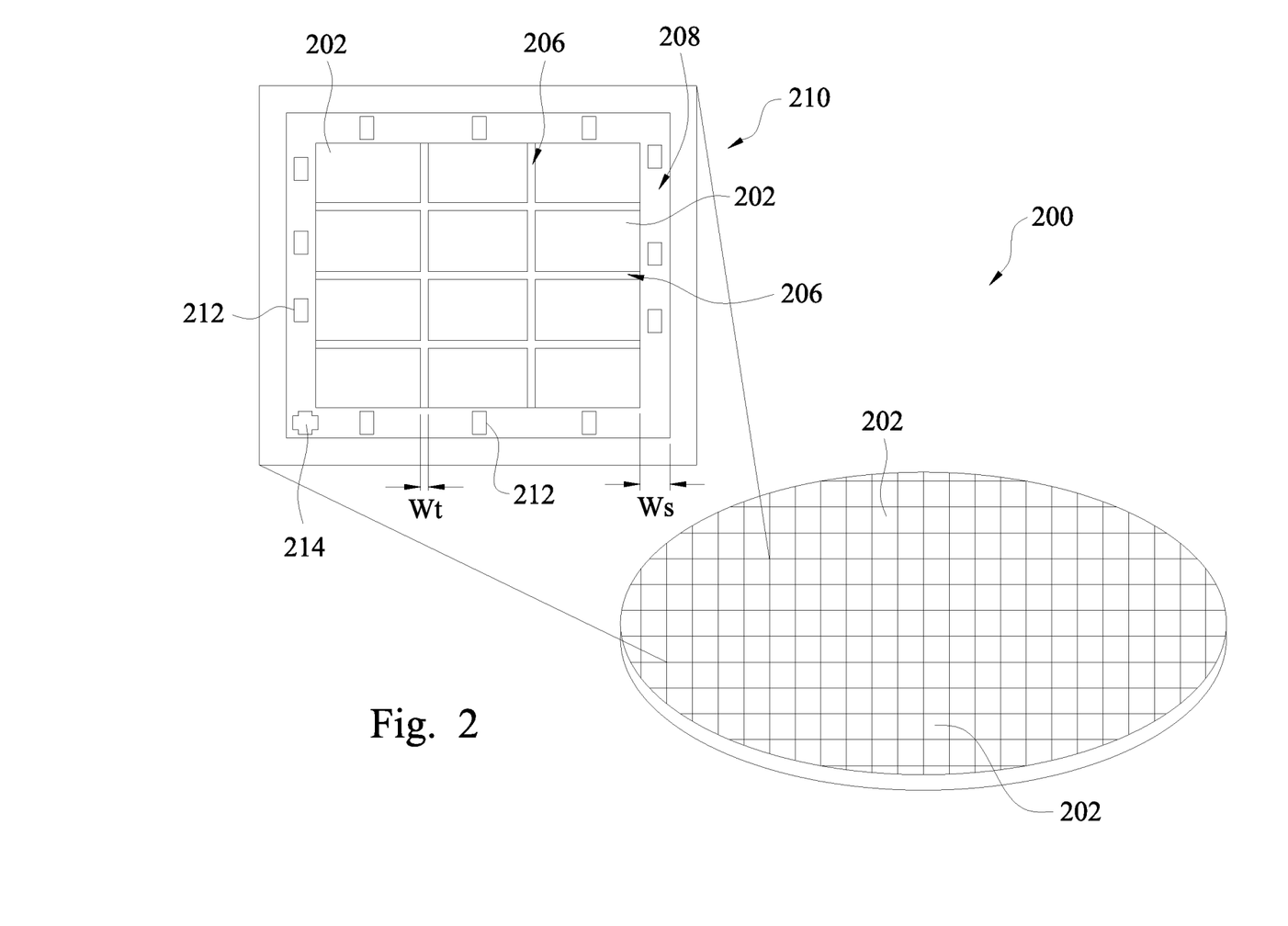
FIG. 2 is a perspective view of a wafer during a method of partitioning the wafer in accordance with some embodiments.

FIG. 2 is a perspective view of a wafer 200 during a partitioning method in accordance with some embodiments. Wafer 200 includes dies 202 formed across the wafer. FIG. 2 also includes an enlarged top view of a set of dies 210. In some embodiments, wafer 200 is a structure after operation 106 of method 100 (FIG. 1).

Set of dies 210 includes dies 202. Dies 202 are surrounded by a scribe line 208. Scribe line 208 has a width Ws. Trenches 206 are located between dies 202 within set of dies 210. Trenches 206 have a width Wt. Width Wt is less than width Ws. Interior dies of set of dies 210 are surrounded on all sides by trenches 206. Edge dies of set of dies 210 have at least one side adjacent to scribe line 208 and at least two sides adjacent trenches 206. Trenches 206 contact scribe line 208 at an external side of edge dies of set of dies 210.

Testing structures 212 are located within scribe line 208. Testing structures 212 are connected to at least some elements within dies 202 by an interconnect structure over substrate 204. Testing structures 212 are usable to test functionality of dies 202. Wafer 200 includes one testing structure 212 for each die 202. In some embodiments, multiple testing structures 212 are provided for each die 202. In some embodiments, one testing structure 212 is connected to more than one die 202.

An alignment mark 214 is also located within scribe line 208. Alignment mark 214 helps with aligning various photomasks used during manufacture of wafer 200. In some embodiments, more than one alignment mark 214 is located within scribe line 208. In some embodiments, every alignment mark 214 has a same shape. In some embodiments, alignment mark 214 has a different shape from another alignment mark.

In some embodiments, each die 202 is a same size. In some embodiments, at least one die 202 has a different size from at least one other die 202. In some embodiments, each die 202 has a same function. In some embodiments, at least one die 202 has a different function from at least another die 202.

In some embodiments, width Wt ranges from about 0.7 μm to about 1.1 μm. In some embodiments, width Wt is the same for each of trenches 206. In some embodiments, at least one trench 206 has a different width from another trench 206.

In some embodiments, width Ws ranges from about 60 μm to about 100 μm. In some embodiments, width Ws is constant around set of dies 210. In some embodiments, at least one portion of scribe line 208 has a different width from another portion of scribe line 208.

Set of dies 210 includes twelve dies 202. In some embodiments, set of dies 210 includes more than twelve dies 202. In some embodiments, set of dies 210 includes fewer than twelve dies 202. A number of dies in set of dies 210 is selectable based on a technology node as well as sufficient area in scribe line 208 to provide testing structures for dies 202 within set of dies 210. If the number of dies in set of dies 210 is too small, then utilization of wafer 200 is not sufficiently increased in some instances. If the number of dies in set of dies 210 is too great, then forming a sufficient number of testing structures in scribe line 208 is difficult.

Figure 3:
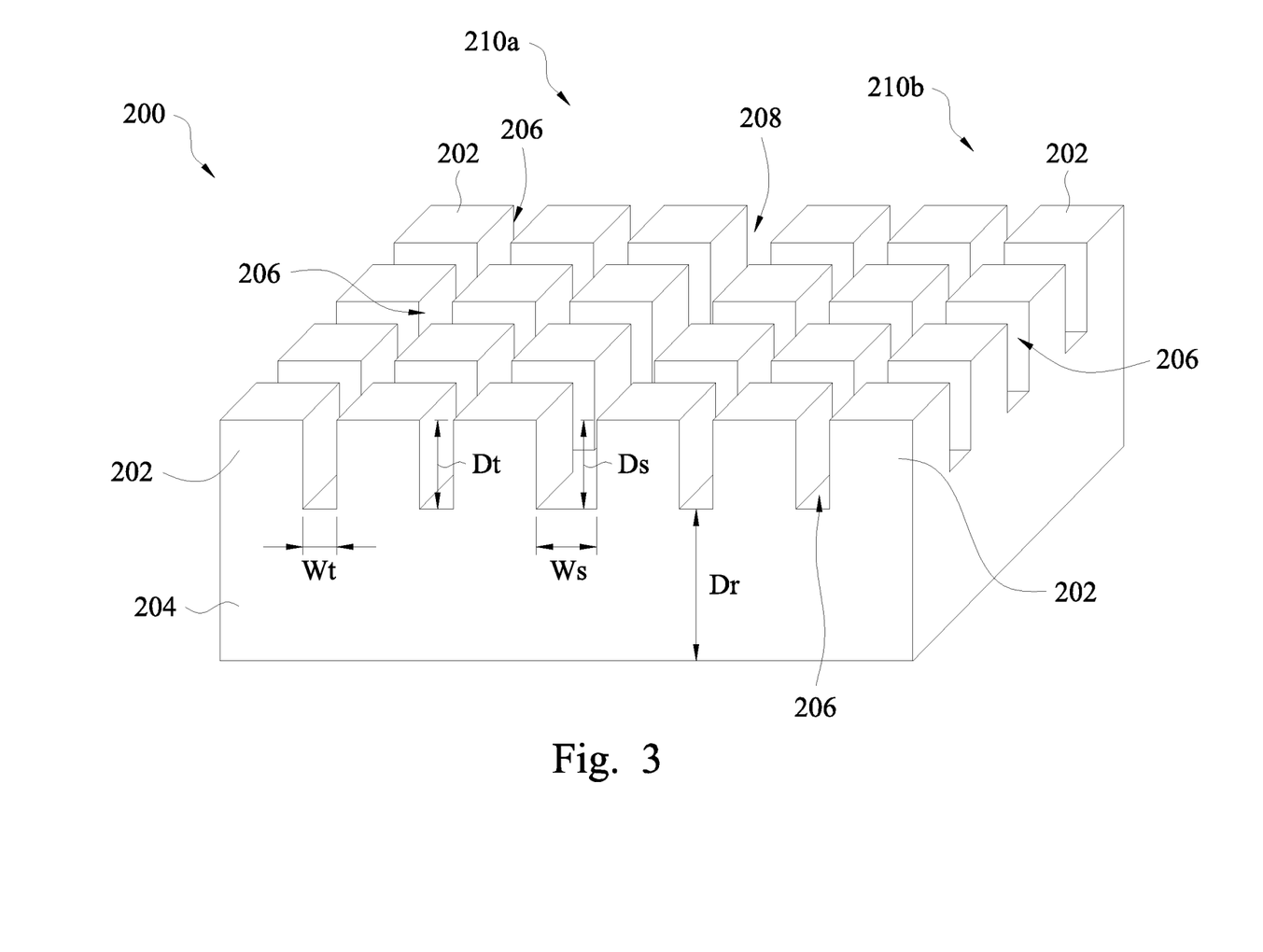
FIG. 3 is a perspective view of a portion of a wafer during a method of partitioning the wafer in accordance with some embodiments.

FIG. 3 is a perspective view of a portion of wafer 200 during a method of partitioning the wafer in accordance with some embodiments. FIG. 3 includes a first set of dies 210a and a second set of dies 210b. Each set of dies 210a and 210b includes dies 202 over a substrate 204. Trenches 206 extend between adjacent dies 202 within each set of dies 210a and 210b. Scribe line 208 is located between first set of dies 210a and second set of dies 210b. Similar to FIG. 2, trenches 206 have a width Wt; and scribe line 208 has a width Ws. Testing structures 212 and alignment mark 214 from FIG. 2 are not shown in FIG. 3 for the sake of simplicity. In some embodiments, wafer 200 is a structure after operation 106 of method 100 (FIG. 1).

Trenches 206 have a depth Dt measured from a height of dies 202 to a bottom surface of the trench. In some embodiments, depth Dt ranges from about 4 μm to about 5.5 μm. Depth Dt is substantially uniform across wafer 200. Depth Dt varies due to variations in manufacturing conditions across wafer 200 in some instances.

Scribe line 208 has a depth Ds less than Dt. In some embodiments, depth Ds ranges from 0 μm to 5 μm. Depth Ds is 0 μm in embodiments where scribe line 208 is coplanar with a top surface of dies 202. If depth Ds is too great, scribe line 208 will be exposed during a wafer thinning process usable to partition dies 202 with set of dies 210a and 210b.

Substrate 204 has a remaining depth Dr measured from a bottom surface of substrate 204 to the bottom surface of trenches 206. In some embodiments, depth Dr ranges from about 0.5 μm to about 1 μm. If depth Dr is too small, then dies 202 will be separated from wafer 200 during the etching process used to form trenches 206. If depth Dr is too large, then duration of the wafer thinning process is increased. In some embodiments, a ratio between depth Dt and depth Dr ranges from about 4.5:1 to about 11:1.

Figure 4:
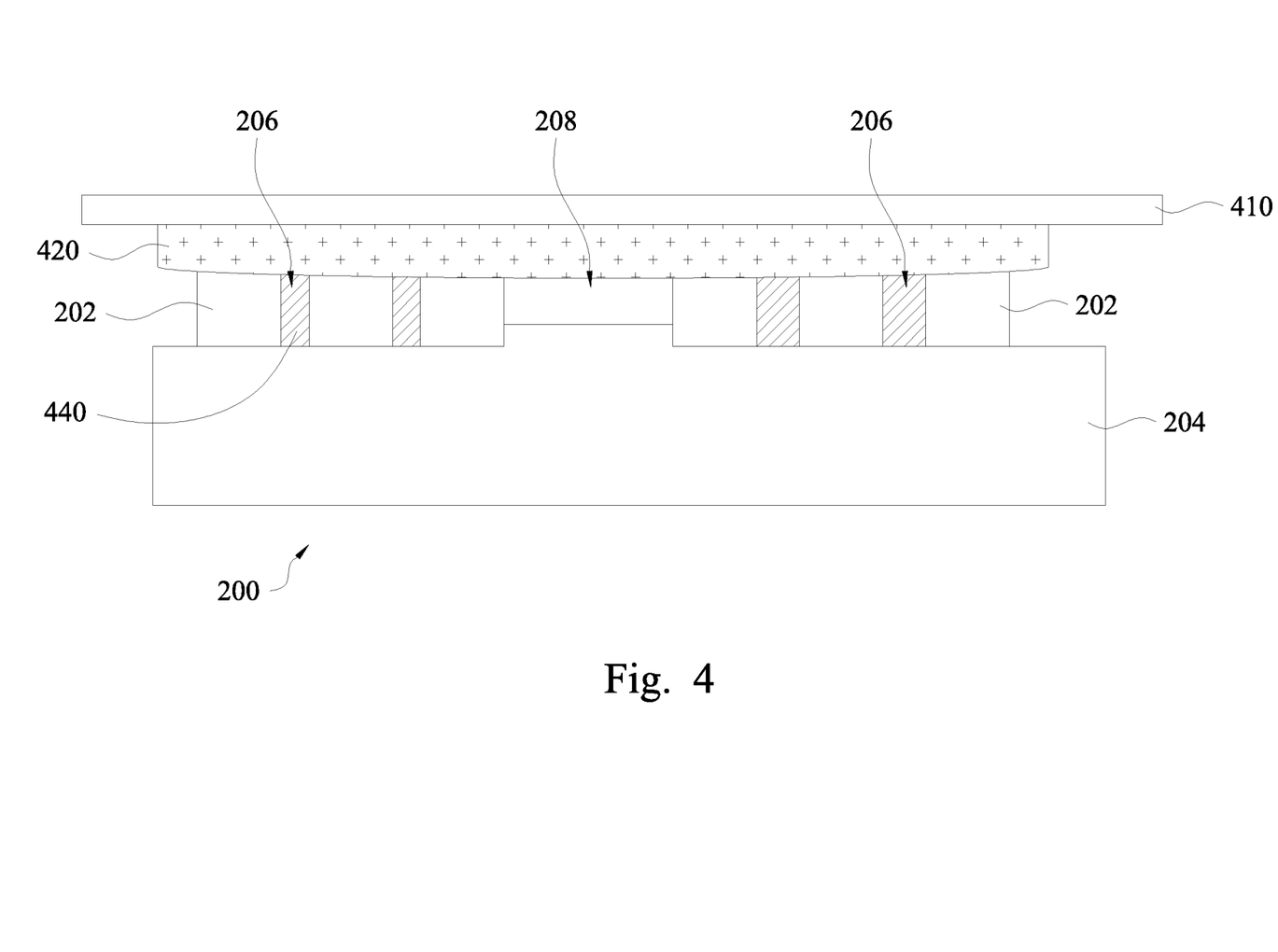
FIG. 4 is a cross-sectional view of a wafer during a method of partitioning the wafer in accordance with some embodiments.

FIG. 4 is a cross-sectional view of a wafer during a manufacturing process in accordance with some embodiments. Same reference numbers in FIG. 4 from FIG. 2 indicate a same element. In comparison with FIG. 2, a carrier 410 is attached to wafer 200 by an adhesive 420. A dielectric material 440 is located in trenches 206 between dies 202. Dielectric material 440 is not in scribe line 208. In some embodiments, dielectric material 440 is in scribe line 208. In some embodiments, dielectric material 440 completely fills scribe line 208. In some embodiments, FIG. 4 is a cross-section view following operation 108 of method 100 (FIG. 1).

Dielectric material 440 completely fills trenches 206. In some embodiments, dielectric material 440 only partially fills trenches 206. Dielectric material 440 provides mechanical support for dies 202 during a wafer thinning process. In some embodiments where the wafer thinning process includes grinding or CMP, dielectric material 440 helps to hold dies 202 in place to increase uniformity of the wafer thinning process. In some embodiments, dielectric material 440 is omitted. Dielectric material 440 is omitted in some embodiments where the wafer thinning process does not include grinding or CMP or if stress induced on dies 202 during the wafer thinning process is not sufficient to warrant inclusion of dielectric material 440. For example, CMP having a low material removal rate followed by an etching process will not exert a high stress on dies 202 and dielectric material 440 is omitted in some instances.

In some embodiments, adhesive 420 is formed on carrier 410 then wafer 200 is brought into contact with adhesive 420. In some embodiments, adhesive 420 is formed by spin-on coating, extrusion, printing or another suitable process. In some embodiments, adhesive 420 is formed on wafer 200 then carrier 410 is brought into contact with adhesive 420. In at least one embodiment, adhesive 420 is a blue type.

In some embodiments, carrier 410 is a blank silicon wafer which does not include any circuitry. In some embodiments, carrier 410 is reusable. In some embodiments, carrier 410 is destroyed during a removal process, e.g., carrier is dissolved by an etching process.

Figure 5:
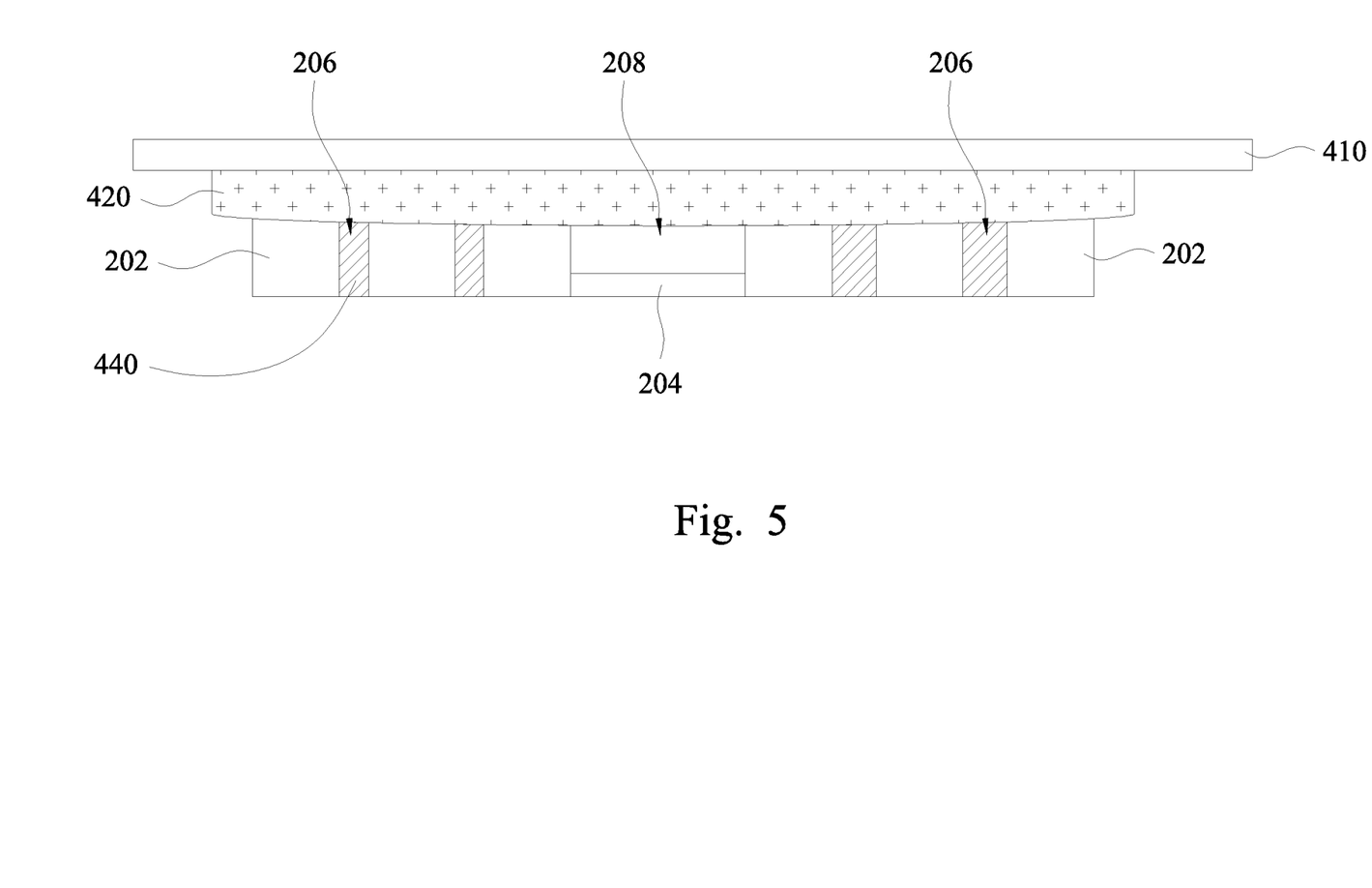
FIG. 5 is a cross-sectional view of a wafer during a method of partitioning the wafer in accordance with some embodiments.

FIG. 5 is a cross-sectional view of a wafer during a manufacturing process in accordance with some embodiments. Same reference numbers in FIG. 5 from FIG. 4 indicate a same element. In comparison with FIG. 4, substrate 204 of wafer 200 is removed by a wafer thinning process. In some embodiments, FIG. 5 is a cross-section view following operation 110 of method 100 (FIG. 1).

Dielectric material 440 at a bottom surface of trenches 206 is exposed by the wafer thinning process. A bottom surface of scribe line 208 remains covered by a portion of substrate 204.

Figure 6:
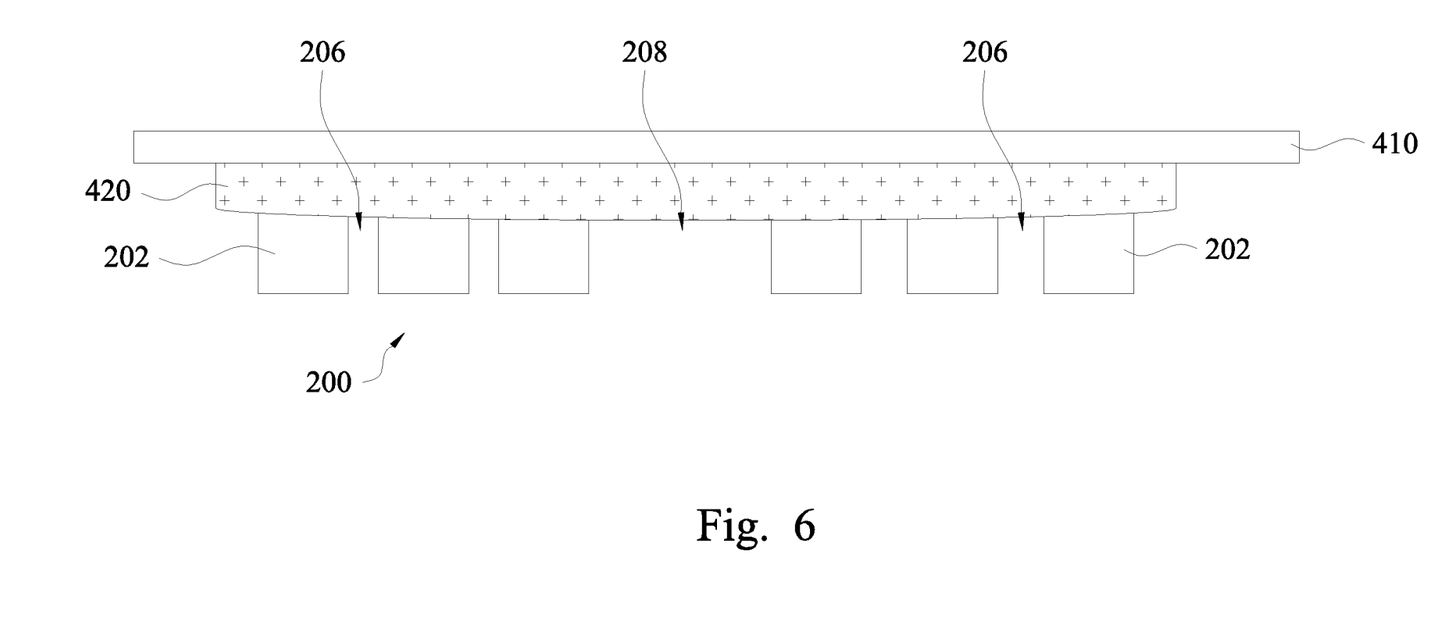
FIG. 6 is a cross-sectional view of a wafer during a method of partitioning the wafer in accordance with some embodiments.

FIG. 6 is a cross-sectional view of a wafer during a manufacturing process in accordance with some embodiments. Same reference numbers in FIG. 6 from FIG. 4 indicate a same element. In comparison with FIG. 5, substrate 204 covering scribe line 208 is removed by a dicing saw. In addition, dielectric material 440 is removed from trenches 206. In some embodiments, FIG. 5 is a cross-section view following operation 112 of method 100 (FIG. 1).

Dielectric material 440 is removed by an etching process. An etchant of the etching process is selected to have a high etch selectivity for dielectric material 440 in comparison with an etch selectivity for exposed materials of dies 202.

In some embodiments, dies 202 are bonded to another chip in order to from a 3DIC. In some embodiments, dies 202 are bonded to a fan-out package. In some embodiments, dies 202 are bonded to an interposer or another suitable structure.

In some embodiments, dies 202 are removed from carrier 410 prior to bonding dies 202 to another structure. In some embodiments, dies 202 are removed from carrier 410 by dissolving adhesive 420, irradiating adhesive 420 with electromagnetic radiation or another suitable process. In some embodiments, dies 202 are removed from adhesive 420 by pushing dies 202 with a pin.

Figure 7:
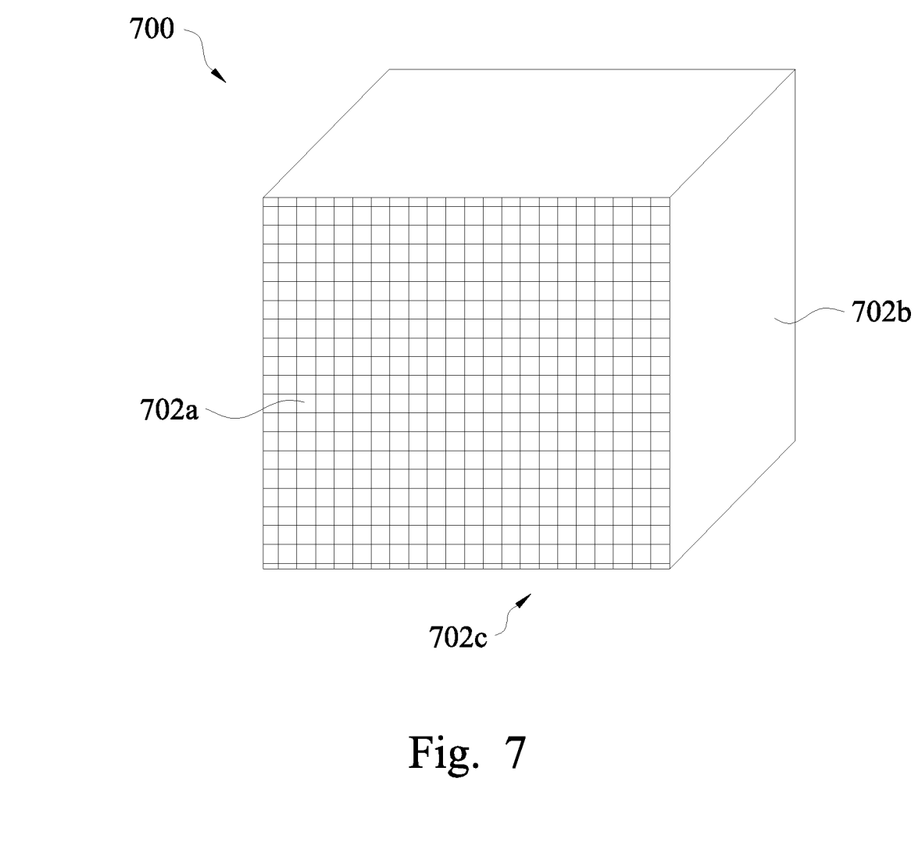
FIG. 7 is a perspective view of a die in accordance with some embodiments.

FIG. 7 is a perspective view of a die 700 in accordance with some embodiments. Die 700 includes a surface 702a and a surface 702b and a surface 702c. Surface 702a has a different surface roughness from surface 702b and from surface 702c. In some embodiments, surface 702b has a different surface roughness from surface 702c. In some embodiments, surface 702a has a greater surface roughness than surface 702b. In some embodiments, surface 702a has a greater surface roughness than surface 702c. In some embodiments, surface 702b has a greater surface roughness than surface 702c. In some embodiments, surface 702c has a greater surface roughness than surface 702b.

In some embodiments, die 700 is obtained using method 100 (FIG. 1). Surface 702a is a surface of die 700 subjected to a dicing saw, i.e., surface 702a was adjacent to a scribe line 208 (FIG. 2). The dicing saw leaves tool marks on surface 702a resulting from the blade of the dicing saw passing along surface 702a. These tool marks result in a surface roughness for surface 702a.

Surface 702b is a surface of die 700 subjected to an etching process, i.e., surface 702b was adjacent to trench 206 (FIG. 2). The etching process used to form trenches, and potentially to remove dielectric material 440 (FIG. 2), will damage surface 702b. The etching process will result in a surface roughness for surface 702b. However, the damage to surface 702b will be different from the tool marks on surface 702a.

Surface 702c is a surface of die 700 subjected to a wafer thinning process, i.e., surface 702c is exposed during the wafer thinning process. The wafer thinning process will damage surface 702c. In some embodiments where the wafer thinning process includes grinding or CMP, surface 702c will have tool marks. However, the tool marks on surface 702c will be different from the tool marks on surface 702a because of a different tool creating the marks, e.g., a grinder in comparison with a dicing saw. In some embodiments where the wafer thinning process includes etching, surface 702c will be damaged by the etching process. The etching process will result in surface roughness for surface 702c. In some embodiments where the etching process used to expose surface 702c during the wafer thinning process is similar to the etching process to form trenches, e.g., trenches 206 (FIG. 2), or remove dielectric material, e.g., dielectric material 440 (FIG. 4), the surface roughness of surface 702c is similar to the surface roughness of surface 702b.

In some embodiments, die 700 includes a single surface having the surface roughness of surface 702a, i.e., die 700 at an edge of set of dies 210 but not at a corner of set of dies 210 (FIG. 2). In some embodiments, die 700 includes two surfaces having the surface roughness of surface 702a, i.e., die 700 at a corner of set of dies 210. In some embodiments, die 700 includes no surfaces having the surface roughness of surface 702a, i.e., die 700 is an interior die of set of dies 210.

In some embodiments, die 700 includes two surfaces having the surface roughness of surface 702b, i.e., die 700 at a corner of set of dies 210 (FIG. 2). In some embodiments, die 700 includes three surfaces having the surface roughness of surface 702b, i.e., die 700 at an edge of set of dies 210 and not a corner of set of dies 210. In some embodiments, die 700 includes four surfaces having the surface roughness of surface 702b, i.e., die 700 is an interior die of set of dies 210.

One aspect of this description relates to a wafer. The wafer includes a first set of dies and a second set of dies. The wafer further includes a scribe line separating the first set of dies from the second set of dies, wherein the scribe line has a first width. The wafer further includes a plurality of trenches between adjacent dies of the first set of dies and connected to the scribe line, wherein the plurality of trenches has a second width less than the first width, and a depth of each trench of the plurality of trenches is less than a thickness of the wafer. In some embodiments, a width of each trench of the plurality of trenches ranges from about 0.7 microns (μm) to about 1.1 μm. In some embodiments, a width of the scribe line ranges from about 60 μm to about 100 μm. In some embodiments, the depth of each trench of the plurality of trenches ranges from about 4 μm to about 5.5 μm.

Another aspect of this description relates to a wafer. The wafer includes a first plurality of dies. The wafer further includes a scribe line surrounding the first plurality of dies, wherein the scribe line has a first width. The wafer further includes a plurality of trenches, wherein each trench of the plurality of trenches separates corresponding adjacent dies of the first plurality of dies, each trench of the plurality of trenches is connected to the scribe line, and each trench of the plurality of trenches has a second width less than the first width. In some embodiments, a depth of each trench of the plurality of trenches is less than a thickness of the wafer. In some embodiments, the wafer further includes a testing structure in the scribe line. In some embodiments, the testing structure is electrically connected to at least one die of the first plurality of dies. In some embodiments, the wafer further includes an alignment mark in the scribe line. In some embodiments, a ratio between a depth of each trench of the plurality of trenches and a thickness of the wafer ranges from about 66% to about 95%. In some embodiments, the wafer further includes a second plurality of dies, wherein the scribe line separates the first plurality of dies from the second plurality of dies. In some embodiments, the first width ranges from about 60 μm to about 100 μm. In some embodiments, the second width ranges from about 0.7 μm to about 1.1 μm. In some embodiments, a depth of the scribe line ranges from about 0 μm to about 5 μm. In some embodiments, a depth of each trench of the plurality of trenches ranges from about 4 μm to about 5.5 μm. In some embodiments, a depth of the scribe line is less than a depth of each trench of the plurality of trenches. In some embodiments, a distance between a bottom surface of the wafer and a bottom of each trench of the plurality of trenches ranges from about 0.5 μm to about 1 μm. In some embodiments, a ratio between a depth of each trench of the plurality of trenches and a distance from a bottom surface of the wafer to a bottom of each trench of the plurality of trenches ranges from about 4.5:1 to about 11:1.

Still another aspect of this description relates to a semiconductor die. The semiconductor die includes a top surface extending in a first plane. The semiconductor die further includes a first side surface extending in a second plane perpendicular to the first plane, wherein the first side surface has a first surface roughness. The semiconductor die further includes a second side surface extending in a third plane perpendicular to the first plane, wherein the second side surface has a second surface roughness different from the first surface roughness. In some embodiments, the first surface roughness comprises tool marks.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A wafer comprising:
   a first set of dies, wherein adjacent dies in the first set of dies are separated by a first distance;
   a second set of dies;
   a scribe line separating the first set of dies from the second set of dies, wherein the scribe line has a first width, wherein a die of the first set of dies closest to the scribe line is separated from a die of the second set of dies closest to the scribe line by a second distance greater than the first distance; and
   a plurality of trenches between adjacent dies of the first set of dies and connected to the scribe line, wherein the plurality of trenches has a second width less than the first width, and a depth of each trench of the plurality of trenches is less than a thickness of the wafer.

2. The wafer of claim 1, wherein a width of each trench of the plurality of trenches ranges from about 0.7 microns (μm) to about 1.1 μm.

3. The wafer of claim 1, wherein a width of the scribe line ranges from about 60 μm to about 100 μm.

4. The wafer of claim 1, wherein the depth of each trench of the plurality of trenches ranges from about 4 μm to about 5.5 μm.

5. A wafer comprising:
   a first plurality of dies;
   a scribe line surrounding the first plurality of dies, wherein the scribe line has a first width, and a space between adjacent dies within the first plurality of dies is free of the scribe line; and
   a plurality of trenches, wherein each trench of the plurality of trenches separates corresponding adjacent dies of the first plurality of dies, each trench of the plurality of trenches is connected to the scribe line, and each trench of the plurality of trenches has a second width less than the first width.

6. The wafer of claim 5, wherein a depth of each trench of the plurality of trenches is less than a thickness of the wafer.

7. The wafer of claim 5, further comprising a testing structure in the scribe line.

8. The wafer of claim 7, wherein the testing structure is electrically connected to at least one die of the first plurality of dies.

9. The wafer of claim 5, further comprising an alignment mark in the scribe line.

10. The wafer of claim 5, wherein a ratio between a depth of each trench of the plurality of trenches and a thickness of the wafer ranges from about 66% to about 95%.

11. The wafer of claim 5, further comprising a second plurality of dies, wherein the scribe line separates the first plurality of dies from the second plurality of dies.

12. The wafer of claim 5, wherein the first width ranges from about 60 μm to about 100 μm.

13. The wafer of claim 5, wherein the second width ranges from about 0.7 μm to about 1.1 μm.

14. The wafer of claim 5, wherein a depth of the scribe line ranges from about 0 μm to about 5 μm.

15. The wafer of claim 5, wherein a depth of each trench of the plurality of trenches ranges from about 4 μm to about 5.5 μm.

16. The wafer of claim 5, wherein a depth of the scribe line is less than a depth of each trench of the plurality of trenches.

17. The wafer of claim 5, wherein a distance between a bottom surface of the wafer and a bottom of each trench of the plurality of trenches ranges from about 0.5 μm to about 1 μm.

18. The wafer of claim 5, wherein a ratio between a depth of each trench of the plurality of trenches and a distance from a bottom surface of the wafer to a bottom of each trench of the plurality of trenches ranges from about 4.5:1 to about 11:1.

19. A semiconductor die comprising:
   a top surface extending in a first plane;
   a first side surface extending in a second plane perpendicular to the first plane, wherein a center of the first side surface has a first surface roughness, and the center of the first side surface exhibits saw tooth marks; and
   a second side surface extending in a third plane perpendicular to the first plane and perpendicular to the second plane, wherein a center of the second side surface has a second surface roughness different from the first surface roughness, and the center of the second side surface is free of saw tooth marks.

20. The semiconductor die of claim 19, wherein the first surface roughness comprises tool marks.

* * * * *